United States Patent
Frieberg et al.

(10) Patent No.: US 11,424,442 B2
(45) Date of Patent: Aug. 23, 2022

(54) METHODS OF FORMING PRELITHIATED SILICON ALLOY ELECTROACTIVE MATERIALS

(71) Applicant: GM GLOBAL TECHNOLOGY OPERATIONS LLC, Detroit, MI (US)

(72) Inventors: Bradley R. Frieberg, Farmington Hills, MI (US); Xiaosong Huang, Novi, MI (US); Zhongyi Liu, Troy, MI (US); Mark W. Verbrugge, Troy, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 268 days.

(21) Appl. No.: 16/706,351

(22) Filed: Dec. 6, 2019

(65) Prior Publication Data
US 2021/0175491 A1  Jun. 10, 2021

(51) Int. Cl.
*H01M 4/1395*  (2010.01)
*H01M 4/04*  (2006.01)
(Continued)

(52) U.S. Cl.
CPC ........ *H01M 4/1395* (2013.01); *H01M 4/045* (2013.01); *H01M 4/0428* (2013.01); *H01M 4/0471* (2013.01); *H01M 10/0525* (2013.01); *H01M 2004/027* (2013.01); *H01M 2004/028* (2013.01)

(58) Field of Classification Search
None
See application file for complete search history.

(56) References Cited

U.S. PATENT DOCUMENTS

| 8,440,350 B1 | 5/2013 | Verbrugge et al. |
| 8,859,144 B2 | 10/2014 | Xiao |

(Continued)

FOREIGN PATENT DOCUMENTS

| CN | 112928242 A | 6/2021 |
| DE | 102020129418 A1 | 6/2021 |

(Continued)

OTHER PUBLICATIONS

Iwamura et al., Li-Rich Li—Si Alloy as a Lithium-Containing Negative Electrode Material Towards High Energy Lithium-Ion Batteries, Scientific Reports; 5 : 8085 | DOI: 10.1038/srep08085. Jan. 28, 2015 (Year: 2015).*

(Continued)

*Primary Examiner* — Tracy M Dove
(74) *Attorney, Agent, or Firm* — Harness, Dickey & Pierce, P.L.C.

(57) ABSTRACT

A method of making a negative electrode material for an electrochemical cell that cycles lithium ions is provided that includes centrifugally distributing a molten precursor comprising silicon and lithium by contacting the molten precursor with a rotating surface in a centrifugal atomizing reactor. The molten precursor is solidified to form a plurality of substantially round solid electroactive particles comprising an alloy of lithium and silicon and having a D50 diameter of less than or equal to about 20 micrometers. In certain variations, the negative electroactive material particles may further have one or more coatings disposed thereon, such as a carbonaceous coating and/or an oxide-based coating.

17 Claims, 5 Drawing Sheets

(51) Int. Cl.
  *B22F 9/10* (2006.01)
  *H01M 10/0525* (2010.01)
  *H01M 4/02* (2006.01)

(56) References Cited

U.S. PATENT DOCUMENTS

| | | | |
|---|---|---|---|
| 8,999,584 B2 | 4/2015 | Jiang et al. | |
| 9,005,811 B2 | 4/2015 | Xiao et al. | |
| 9,093,705 B2 | 7/2015 | Xiao et al. | |
| 9,142,830 B2 | 9/2015 | Xiao et al. | |
| 9,302,914 B2 | 4/2016 | Liu et al. | |
| 9,362,551 B2 | 6/2016 | Sachdev et al. | |
| 9,379,374 B2 | 6/2016 | Liu et al. | |
| 9,531,004 B2 | 12/2016 | Xiao et al. | |
| 9,564,639 B2 | 2/2017 | Huang | |
| 9,570,752 B2 | 2/2017 | Huang et al. | |
| 9,577,251 B2 | 2/2017 | Xiao et al. | |
| 9,780,361 B2 | 10/2017 | Xiao et al. | |
| 10,062,898 B2 | 8/2018 | Xiao | |
| 10,164,245 B2 | 12/2018 | Huang | |
| 2014/0315086 A1* | 10/2014 | Put | H01M 4/0428 429/220 |
| 2018/0205114 A1 | 7/2018 | Pauric et al. | |
| 2019/0051904 A1* | 2/2019 | Zhamu | H01M 4/366 |
| 2020/0119339 A1 | 4/2020 | Halalay et al. | |

FOREIGN PATENT DOCUMENTS

| | | |
|---|---|---|
| GB | 2566766 A | 3/2019 |
| WO | 2017014675 A1 | 1/2017 |

OTHER PUBLICATIONS

A. G. Morachevskii et al., Lithium-Silicon Alloys: Phase Diagram, Electrochemical Studies, Thermodynamic Properties, Application in Chemical Power Cells. Russian Journal of Applied Chemistry, 2015, vol. 88, No. 4, pp. 547-566. (Year: 2015).*

Halalay, Ion C. et al., U.S. Appl. No. 16/160,799, filed Oct. 15, 2018 entitled, "Method for Making Silicon-Containing Composite Electrodes for Lithium-Based Batteries," 47 pages.

Wang, Lei et al., U.S. Appl. No. 16/668,864, filed Oct. 30, 2019 entitled, "Method for Making Silicon-Carbon Composite Electrode Materials," 46 pages.

Li, Juchuan et al., "Atomic Layered Coating Enabling Ultrafast Surface Kinetics at Silicon Electrodes in Lithium Ion Batteries," J. Phys. Chem. Lett. (2013), 4, pp. 3387-3391; DOI: 10.1021/jz4018255.

Okamoto, H., "Li—Si (Lithium-Silicon)," Journal of Phase Equilibria and Diffusion, vol. 30, No. 1 (2009), pp. 118-119 DOI: 10.1007/s11669-008-9431-8.

Verbrugge, Mark et al., "Fabrication and Characterzation of Lithium-Silicon Thick-Film Electrodes for High-Energy-Density Batteries," Journal of the Electrochemical Society 164 (2), pp. A156-A167; DOI: 10.1149/2.0521702jes (Published Dec. 17, 2016).

Xiao, Xingcheng et al., U.S. Appl. No. 16/239,027, filed Jan. 3, 2019 entitled "Method for In Situ Growth of Axial Geometry Carbon Structures in Electrodes," 38 pages.

Liu, Zhongyi et al., U.S. Appl. No. 16/681,321, filed Nov. 12, 2019 entitled "Article for Producing Ultra-Fine Powders and Method of Manufacutre Thereof," 27 pages.

* cited by examiner

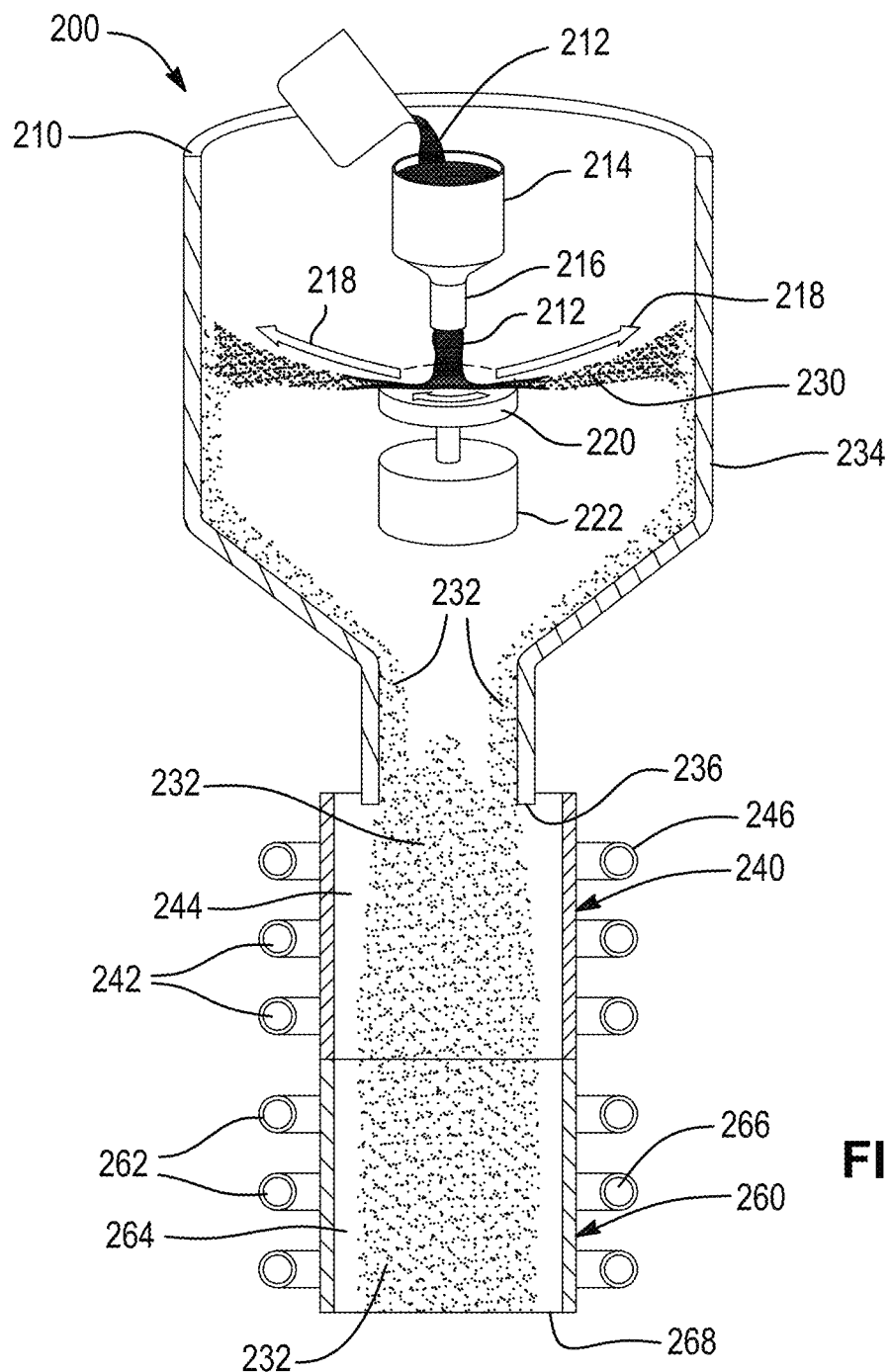
FIG. 7
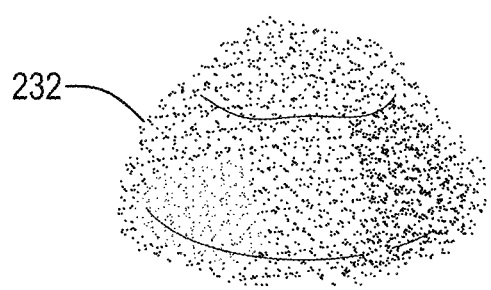

METHODS OF FORMING PRELITHIATED SILICON ALLOY ELECTROACTIVE MATERIALS

INTRODUCTION

This section provides background information related to the present disclosure which is not necessarily prior art.

The present disclosure pertains to methods of forming prelithiated electroactive materials for use in negative electrodes of lithium ion electrochemical cells. The method includes centrifugally distributing a molten precursor comprising silicon and lithium in a centrifugal atomizing reactor. The negative electroactive materials may further have one or more coatings disposed thereon, such as a carbonaceous coating and/or an oxide-based coating.

High-energy density, electrochemical cells, such as lithium ion batteries can be used in a variety of consumer products and vehicles, such as Hybrid Electric Vehicles (HEVs) and Electric Vehicles (EVs). Typical liquid or semi-solid lithium ion and lithium sulfur batteries comprise a first electrode (e.g., a cathode), a second electrode (e.g., an anode), an electrolyte material, and a separator component. Solid-state lithium-based batteries also include a first electrode (e.g., a cathode), a second electrode (e.g., an anode), and a solid-state electrolyte material. The solid-state electrolyte serves as both a conductor of lithium ions and a separator, such that a distinct separator component is not required. Often a stack of battery cells is electrically connected to increase overall output. Conventional lithium ion batteries operate by reversibly passing lithium ions between the negative electrode and the positive electrode. The electrolyte is suitable for conducting lithium ions and may be in solid or liquid form. Lithium ions move from a cathode (positive electrode) to an anode (negative electrode) during charging of the battery, and in the opposite direction when discharging the battery.

Contact of the anode and cathode materials with the electrolyte can create an electrical potential between the electrodes. When electric current is generated in an external circuit between the electrodes, the potential is sustained by electrochemical reactions within the cells of the battery. Each of the negative and positive electrodes within a stack is connected to a current collector (typically a metal, such as copper for the anode and aluminum for the cathode). During battery usage, the current collectors associated with the two electrodes are connected by an external circuit that allows current generated by electrons to pass between the electrodes to compensate for transport of lithium ions.

Typical electrochemically active materials for forming an anode include lithium-graphite intercalation compounds, lithium-silicon alloying compounds, lithium-tin alloying compounds, and lithium alloys. While graphite compounds are most common, recently, anode materials with high specific capacity (in comparison with conventional graphite) are of growing interest. For example, silicon has the highest known theoretical charge capacity for lithium, making it one of the most promising materials for rechargeable lithium ion batteries. However, current anode materials comprising silicon can potentially suffer from significant drawbacks.

For example, during an initial lithiation and delithation cycle, the silicon-based electroactive material can undergo excessive volumetric expansion and contraction. Further, additional volumetric changes may occur during successive charging and discharging cycles is observed for silicon electroactive materials. Such volumetric changes can lead to fatigue cracking and decrepitation of the electroactive material. This may potentially lead to a loss of electrical contact between the silicon-containing electroactive material and the rest of the battery cell as well as the consumption of electrolyte to form new solid electrolyte interface (SEI), resulting in a decline of electrochemical cyclic performance, diminished Coulombic charge capacity retention (capacity fade), and limited cycle life. This is especially true at electrode loading levels required for the application of silicon containing electrodes in high-energy lithium ion batteries, such as those used in transportation applications.

Accordingly, it would be desirable to develop methods of making electroactive materials comprising silicon or other electroactive materials that undergo significant volumetric changes during lithium ion cycling that are capable of minimal capacity fade and maximized charge capacity in commercial lithium ion batteries with long lifespans, especially for transportation applications.

SUMMARY

This section provides a general summary of the disclosure, and is not a comprehensive disclosure of its full scope or all of its features.

The present disclosure relates to method of making a negative electrode material for an electrochemical cell that cycles lithium ions, the method including centrifugally distributing a molten precursor including silicon and lithium by contacting the molten precursor with a rotating surface in a centrifugal atomizing reactor. The method also includes solidifying the molten precursor to form a plurality of substantially round solid electroactive particles including an alloy of lithium and silicon. The plurality of substantially round solid electroactive particles have a D50 diameter of less than or equal to about 20 micrometers.

In certain aspects, the alloy is represented by the formula $Li_{4.4x}Si$, where x is greater than 0 to less than or equal to about 0.85.

In certain aspects, the alloy is represented by the formula $Li_{4.4x}Si$, where x is greater than or equal to about 0.1 to less than or equal to about 0.5.

In certain aspects, the alloy includes a phase selected from the group consisting of: $Li_{22}Si_5$, $Li_{13}Si_4$, $Li_7Si_3$, $Li_{12}Si_7$, $LiSi$, $Si$, and combinations thereof.

In certain aspects, a temperature in the centrifugal atomizing reactor is greater than or equal to 400° C. to less than or equal to about 1,000° C. during the centrifugally distributing.

In certain aspects, an environment in the centrifugal atomizing reactor has less than or equal to about 0.5% by weight of any oxygen-bearing species.

In certain aspects, a flow rate of the centrifugal atomizing reactor is greater than or equal to 50 kg/hour to less than or equal to about 500 kg/hour.

In certain aspects, the D50 diameter is greater than or equal to about 1 μm to less than or equal to about 10 μm. Further, the plurality of substantially round solid electroactive particles has a polydispersity index of less than or equal to about 1.2.

The present disclosure also relates to method of making a negative electrode for an electrochemical cell that cycles lithium ions. The method includes centrifugally distributing a molten precursor including silicon and lithium by contacting the molten precursor with a rotating surface in a centrifugal atomizing reactor. The molten precursor is solidified to form a plurality of substantially round solid electroactive particles including an alloy of lithium and silicon. The plurality of substantially round solid electroactive particles has a D50 diameter of less than or equal to about 20 micrometers. The method also includes passing the plurality of substantially round solid electroactive particles into a distinct reactor chamber in fluid communication with the centrifugal atomizing reactor. A coating is applied to respective surfaces of the plurality of substantially round solid electroactive particles.

In certain aspects, the coating includes an oxide-based coating selected from the group consisting of: aluminum oxide ($Al_2O_3$), titanium dioxide ($TiO_2$), silicon dioxide ($SiO_2$), vanadium pentoxide ($V_2O_5$), zirconium dioxide ($ZrO_2$), hafnium dioxide ($HfO_2$), tin oxide ($SnO_2$), zinc oxide (ZnO), and combinations thereof.

In certain aspects, the applying is an atomic layer deposition (ALD) process.

In certain aspects, the applying is pyrolyzing a carbon-containing precursor at a temperature of greater than or equal to about 600° C. to less than or equal to about 1,400° C. The coating includes a carbonaceous coating including both graphitic carbon and amorphous carbon.

In certain aspects, the distinct reactor chamber is a first reactor chamber and the coating is a first coating. The passing further includes passing the plurality of substantially round solid electroactive particles from the first reactor chamber into a second distinct reactor chamber in fluid communication with the first reactor chamber to apply a second coating over the first coating on the plurality of substantially round solid electroactive particles.

In certain further aspects, (i) the first coating includes a carbonaceous coating and the second coating includes an oxide-based coating or (ii) the first coating includes an oxide-based coating and the second coating includes a carbonaceous coating.

In certain aspects, the alloy is represented by the formula $Li_{4.4x}Si$, where x is greater than 0 and less than or equal to about 0.85.

In certain aspects, a temperature in the centrifugal atomizing reactor is greater than or equal to 400° C. to less than or equal to about 1,000° C. during the centrifugally distributing.

In certain aspects, an environment in the centrifugal atomizing reactor has less than or equal to about 0.5% by weight of any oxygen-bearing species.

The present disclosure also contemplates a negative electroactive particle for an electrochemical cell that cycles lithium ions. The negative electroactive particle includes a core region including an alloy including silicon and lithium having greater than 0 atomic % to less than or equal to about 82 atomic % of lithium and correspondingly greater than or equal to about 18 atomic % to less than 100 atomic % of silicon. The core region has a D50 diameter of less than or equal to about 20 micrometers. The negative electroactive particle includes one or more coatings disposed over the core region selected from an oxide-based coating and a carbon-based coating.

In certain aspects, the one or more coatings include either: (i) a first coating disposed over a surface of the core region including a carbonaceous coating and a second coating disposed over the first coating including an oxide-based coating; or (ii) a first coating disposed over a surface of the core region including an oxide-based coating and a second coating disposed over the first coating including a carbonaceous coating.

In certain aspects, the carbonaceous coating includes both graphitic carbon and amorphous carbon and the oxide-based coating includes aluminum oxide ($Al_2O_3$).

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIG. 7 shows an exemplary centrifugal atomizing reactor integrated with reactor chambers for gas phase coating of the electroactive material particles in accordance with certain aspects of the present disclosure.

Corresponding reference numerals indicate corresponding parts throughout the several views of the drawings.

DETAILED DESCRIPTION

Figure 1:
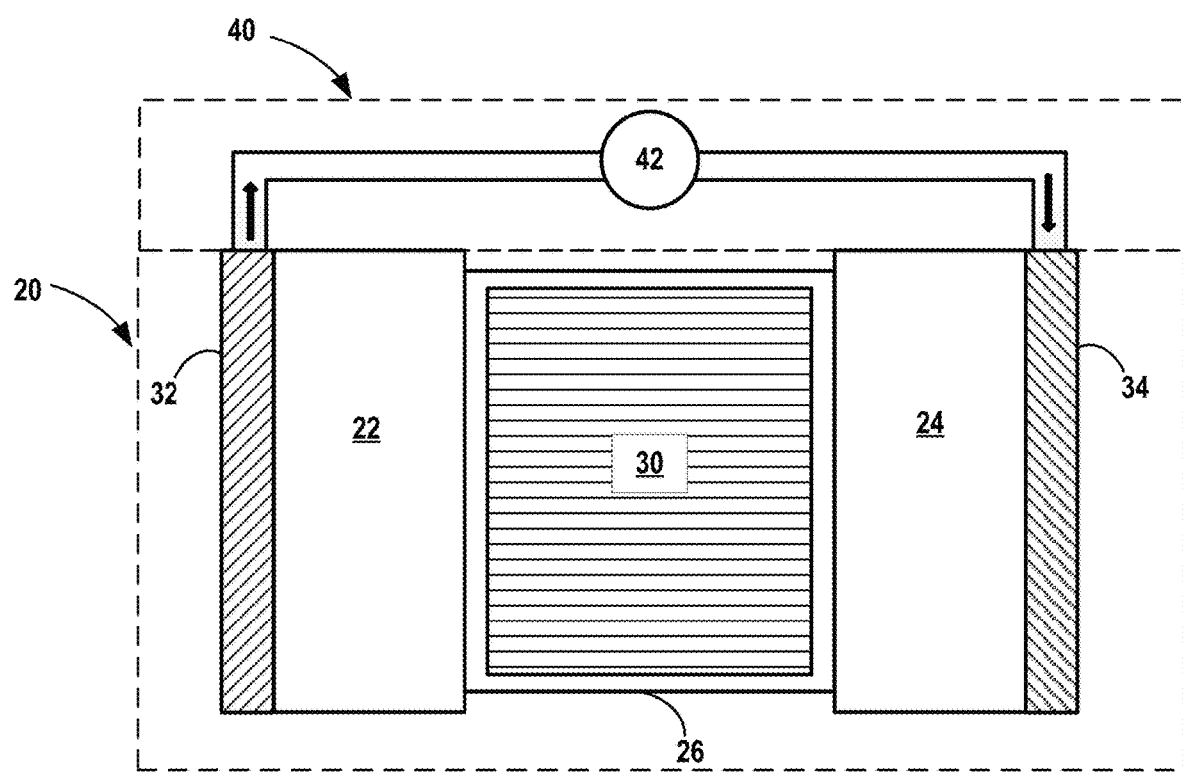
FIG. 1 is a schematic of an example electrochemical battery cell.

Example embodiments are provided so that this disclosure will be thorough, and will fully convey the scope to those who are skilled in the art. Numerous specific details are set forth such as examples of specific compositions, components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, elements, compositions, steps, integers, operations, and/or components, but do not preclude the presence or addition of one or more other features, integers, steps, operations, elements, components, and/or groups thereof. Although the open-ended term "comprising," is to be understood as a non-restrictive term used to describe and claim various embodiments set forth herein, in certain aspects, the term may alternatively be understood to instead be a more limiting and restrictive term, such as "consisting of" or "consisting essentially of" Thus, for any given embodiment reciting compositions, materials, components, elements, features, integers, operations, and/or process steps, the present disclosure also specifically includes embodiments consisting of, or consisting essentially of, such recited compositions, materials, components, elements, features, integers, operations, and/or process steps. In the case of "consisting of," the alternative embodiment excludes any additional compositions, materials, components, elements, features, integers, operations, and/or process steps, while in the case of "consisting essentially of," any additional compositions, materials, components, elements, features, integers, operations, and/or process steps that materially affect the basic and novel characteristics are excluded from such an embodiment, but any compositions, materials, components, elements, features, integers, operations, and/or process steps that do not materially affect the basic and novel characteristics can be included in the embodiment.

Any method steps, processes, and operations described herein are not to be construed as necessarily requiring their performance in the particular order discussed or illustrated, unless specifically identified as an order of performance. It is also to be understood that additional or alternative steps may be employed, unless otherwise indicated.

When a component, element, or layer is referred to as being "on," "engaged to," "connected to," or "coupled to" another element or layer, it may be directly on, engaged, connected or coupled to the other component, element, or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various steps, elements, components, regions, layers and/or sections, these steps, elements, components, regions, layers and/or sections should not be limited by these terms, unless otherwise indicated. These terms may be only used to distinguish one step, element, component, region, layer or section from another step, element, component, region, layer or section. Terms such as "first," "second," and other numerical terms when used herein do not imply a sequence or order unless clearly indicated by the context. Thus, a first step, element, component, region, layer or section discussed below could be termed a second step, element, component, region, layer or section without departing from the teachings of the example embodiments.

Spatially or temporally relative terms, such as "before," "after," "inner," "outer," "beneath," "below," "lower," "above," "upper," and the like, may be used herein for ease of description to describe one element or feature's relationship to another element(s) or feature(s) as illustrated in the figures. Spatially or temporally relative terms may be intended to encompass different orientations of the device or system in use or operation in addition to the orientation depicted in the figures.

Throughout this disclosure, the numerical values represent approximate measures or limits to ranges to encompass minor deviations from the given values and embodiments having about the value mentioned as well as those having exactly the value mentioned. Other than in the working examples provided at the end of the detailed description, all numerical values of parameters (e.g., of quantities or conditions) in this specification, including the appended claims, are to be understood as being modified in all instances by the term "about" whether or not "about" actually appears before the numerical value. "About" indicates that the stated numerical value allows some slight imprecision (with some approach to exactness in the value; approximately or reasonably close to the value; nearly). If the imprecision provided by "about" is not otherwise understood in the art with this ordinary meaning, then "about" as used herein indicates at least variations that may arise from ordinary methods of measuring and using such parameters. For example, "about" may comprise a variation of less than or equal to 5%, optionally less than or equal to 4%, optionally less than or equal to 3%, optionally less than or equal to 2%, optionally less than or equal to 1%, optionally less than or equal to 0.5%, and in certain aspects, optionally less than or equal to 0.1%.

In addition, disclosure of ranges includes disclosure of all values and further divided ranges within the entire range, including endpoints and sub-ranges given for the ranges.

As used herein, the terms "composition" and "material" are used interchangeably to refer broadly to a substance containing at least the preferred chemical constituents, elements, or compounds, but which may also comprise additional elements, compounds, or substances, including trace amounts of impurities, unless otherwise indicated.

Example embodiments will now be described more fully with reference to the accompanying drawings.

The present technology pertains to improved electrochemical cells, especially lithium-ion batteries. In various instances, such cells are used in vehicle or automotive transportation applications (e.g., motorcycles, boats, tractors, buses, motorcycles, mobile homes, campers, and tanks). However, the present technology may be employed in a wide variety of other industries and applications, including aerospace components, consumer goods, devices, buildings (e.g., houses, offices, sheds, and warehouses), office equipment and furniture, and industrial equipment machinery, agricultural or farm equipment, or heavy machinery, by way of non-limiting example.

An exemplary illustration of an electrochemical cell or battery for cycling lithium ions is shown in FIG. 1. The battery 20 includes a negative electrode 22, a positive electrode 24, and a separator 26 (e.g., a microporous polymeric separator) disposed between the two electrodes 22, 24. The separator 26 comprises an electrolyte 30, which may also be present in the negative electrode 22 and positive electrode 24. A negative electrode current collector 32 may be positioned at or near the negative electrode, 22 and a positive electrode current collector 34 may be positioned at or near the positive electrode 24. An interruptible external circuit 40 and load device 42 connects the negative electrode 22 (through its current collector 32) and the positive electrode 24 (through its current collector 34).

The battery 20 can generate an electric current during discharge by way of reversible electrochemical reactions that occur when the external circuit 40 is closed (to connect the negative electrode 22 and the positive electrode 24) and the negative electrode 22 has a lower potential than the positive electrode. The chemical potential difference between the positive electrode 24 and the negative electrode 22 drives electrons produced by a reaction, for example, the oxidation of intercalated lithium, at the negative electrode 22 through the external circuit 40 towards the positive electrode 24. Lithium ions that are also produced at the negative electrode 22 are concurrently transferred through the electrolyte 30 contained in the separator 26 towards the positive electrode 24. The electrons flow through the external circuit 40 and the lithium ions migrate across the separator 26 containing the electrolyte solution 30 to form intercalated lithium at the positive electrode 24. As noted above, electrolyte 30 is typically also present in the negative electrode 22 and positive electrode 24. The electric current passing through the external circuit 40 can be harnessed and directed through the load device 42 until the lithium in the negative electrode 22 is depleted and the capacity of the battery 20 is diminished.

The battery 20 can be charged or re-energized at any time by connecting an external power source to the lithium ion battery 20 to reverse the electrochemical reactions that occur during battery discharge. Connecting an external electrical energy source to the battery 20 promotes a reaction, for example, non-spontaneous oxidation of intercalated lithium, at the positive electrode 24 so that electrons and lithium ions are produced. The lithium ions flow back towards the negative electrode 22 through the electrolyte 30 across the separator 26 to replenish the negative electrode 22 with lithium (e.g., intercalated lithium) for use during the next battery discharge event. As such, a complete discharging event followed by a complete charging event is considered to be a cycle, where lithium ions are cycled between the positive electrode 24 and the negative electrode 22. The external power source that may be used to charge the battery 20 may vary depending on the size, construction, and particular end-use of the battery 20. Some notable and exemplary external power sources include, but are not limited to, an AC-DC converter connected to an AC electrical power grid though a wall outlet and a motor vehicle alternator.

In many lithium-ion battery configurations, each of the negative electrode current collector 32, negative electrode 22, the separator 26, positive electrode 24, and positive electrode current collector 34 are prepared as relatively thin layers (for example, from several microns to a fraction of a millimeter or less in thickness) and assembled in layers connected in electrical parallel arrangement to provide a suitable electrical energy and power package. The negative electrode current collector 32 and positive electrode current collector 34 respectively collect and move free electrons to and from an external circuit 40.

Further, the separator 26 operates as an electrical insulator by being sandwiched between the negative electrode 22 and the positive electrode 24 to prevent physical contact and thus, the occurrence of a short circuit. The separator 26 provides not only a physical and electrical barrier between the two electrodes 22, 24, but also contains the electrolyte solution in a network of open pores during the cycling of lithium ions, to facilitate functioning of the battery 20.

Furthermore, the battery 20 can include a variety of other components that while not depicted here are nonetheless known to those of skill in the art. For instance, the battery 20 may include a casing, gaskets, terminal caps, tabs, battery terminals, and any other conventional components or materials that may be situated within the battery 20, including between or around the negative electrode 22, the positive electrode 24, and/or the separator 26. The battery 20 described above includes a liquid electrolyte and shows representative concepts of battery operation. However, the battery 20 may also be a solid-state battery that includes a solid-state electrolyte that may have a different design, as known to those of skill in the art.

As noted above, the size and shape of the battery 20 may vary depending on the particular application for which it is designed. Battery-powered vehicles and hand-held consumer electronic devices, for example, are two examples where the battery 20 would most likely be designed to different size, capacity, and power-output specifications. The battery 20 may also be connected in series or parallel with other similar lithium-ion cells or batteries to produce a greater voltage output, energy, and power if it is required by the load device 42. Accordingly, the battery 20 can generate electric current to a load device 42 that is part of the external circuit 40. The load device 42 may be powered by the electric current passing through the external circuit 40 when the battery 20 is discharging. While the electrical load device 42 may be any number of known electrically-powered devices, a few specific examples include an electric motor for an electrified vehicle, a laptop computer, a tablet computer, a cellular phone, and cordless power tools or appliances. The load device 42 may also be an electricity-generating apparatus that charges the battery 20 for purposes of storing electrical energy.

With renewed reference to FIG. 1, the positive electrode 24, the negative electrode 22, and the separator 26 may each include an electrolyte solution or system 30 inside their pores, capable of conducting lithium ions between the negative electrode 22 and the positive electrode 24. Any appropriate electrolyte 30, whether in solid, liquid, or gel form, capable of conducting lithium ions between the negative electrode 22 and the positive electrode 24 may be used in the lithium-ion battery 20. In certain aspects, the electrolyte 30 may be a non-aqueous liquid electrolyte solution that includes a lithium salt dissolved in an organic solvent or a mixture of organic solvents. Numerous conventional non-aqueous liquid electrolyte 30 solutions may be employed in the lithium-ion battery 20.

In certain aspects, the electrolyte 30 may be a non-aqueous liquid electrolyte solution that includes one or more lithium salts dissolved in an organic solvent or a mixture of organic solvents. Numerous aprotic non-aqueous liquid electrolyte solutions may be employed in the lithium-ion battery 20. For example, a non-limiting list of lithium salts that may be dissolved in an organic solvent to form the non-aqueous liquid electrolyte solution include lithium hexafluorophosphate ($LiPF_6$), lithium perchlorate ($LiClO_4$), lithium tetrachloroaluminate ($LiAlCl_4$), lithium iodide (LiI), lithium bromide (LiBr), lithium thiocyanate (LiSCN), lithium tetrafluoroborate ($LiBF_4$), lithium tetraphenylborate ($LiB(C_6H_5)_4$), lithium bis(oxalato)borate ($LiB(C_2O_4)_2$) (LiBOB), lithium difluorooxalatoborate ($LiBF_2(C_2O_4)$), lithium hexafluoroarsenate ($LiAsF_6$), lithium trifluoromethanesulfonate ($LiCF_3SO_3$), lithium bis(trifluoromethane) sulfonylimide ($LiN(CF_3SO_2)_2$), lithium bis(fluorosulfonyl) imide ($LiN(FSO_2)_2$) (LiSFI), and combinations thereof.

These and other similar lithium salts may be dissolved in a variety of aprotic organic solvents, including but not limited to, various alkyl carbonates, such as cyclic carbonates (e.g., ethylene carbonate (EC), propylene carbonate (PC), butylene carbonate (BC), fluoroethylene carbonate (FEC)), linear carbonates (e.g., dimethyl carbonate (DMC), diethyl carbonate (DEC), ethylmethylcarbonate (EMC)), aliphatic carboxylic esters (e.g., methyl formate, methyl acetate, methyl propionate), γ-lactones (e.g., γ-butyrolactone, γ-valerolactone), chain structure ethers (e.g., 1,2-dimethoxyethane, 1-2-diethoxyethane, ethoxymethoxyethane), cyclic ethers (e.g., tetrahydrofuran, 2-methyltetrahydrofuran), 1,3-dioxolane), sulfur compounds (e.g., sulfolane), and combinations thereof.

The porous separator 26 may include, in certain instances, a microporous polymeric separator including a polyolefin. The polyolefin may be a homopolymer (derived from a single monomer constituent) or a heteropolymer (derived from more than one monomer constituent), which may be either linear or branched. If a heteropolymer is derived from two monomer constituents, the polyolefin may assume any copolymer chain arrangement, including those of a block copolymer or a random copolymer. Similarly, if the polyolefin is a heteropolymer derived from more than two monomer constituents, it may likewise be a block copolymer or a random copolymer. In certain aspects, the polyolefin may be polyethylene (PE), polypropylene (PP), or a blend of PE and PP, or multi-layered structured porous films of PE and/or PP. Commercially available polyolefin porous separator membranes 26 include CELGARD® 2500 (a monolayer polypropylene separator) and CELGARD® 2320 (a trilayer polypropylene/polyethylene/polypropylene separator) available from Celgard LLC.

In certain aspects, the separator 26 may further include one or more of a ceramic coating layer and a heat-resistant material coating. The ceramic coating layer and/or the heat-resistant material coating may be disposed on one or more sides of the separator 26. The material forming the ceramic layer may be selected from the group consisting of: alumina ($Al_2O_3$), silica ($SiO_2$), and combinations thereof. The heat-resistant material may be selected from the group consisting of: Nomex, Aramid, and combinations thereof.

When the separator 26 is a microporous polymeric separator, it may be a single layer or a multi-layer laminate, which may be fabricated from either a dry or a wet process. For example, in certain instances, a single layer of the polyolefin may form the entire separator 26. In other aspects, the separator 26 may be a fibrous membrane having an abundance of pores extending between the opposing surfaces and may have an average thickness of less than a millimeter, for example. As another example, however, multiple discrete layers of similar or dissimilar polyolefins may be assembled to form the microporous polymer separator 26. The separator 26 may also comprise other polymers in addition to the polyolefin such as, but not limited to, polyethylene terephthalate (PET), polyvinylidene fluoride (PVdF), a polyamide, polyimide, poly(amide-imide) copolymer, polyetherimide, and/or cellulose, or any other material suitable for creating the required porous structure. The polyolefin layer, and any other optional polymer layers, may further be included in the separator 26 as a fibrous layer to help provide the separator 26 with appropriate structural and porosity characteristics. In certain aspects, the separator 26 may also be mixed with a ceramic material or its surface may be coated in a ceramic material. For example, a ceramic coating may include alumina ($Al_2O_3$), silicon dioxide ($SiO_2$), titania ($TiO_2$) or combinations thereof. Various conventionally available polymers and commercial products for forming the separator 26 are contemplated, as well as the many manufacturing methods that may be employed to produce such a microporous polymer separator 26.

In various aspects, the porous separator 26 and the electrolyte 30 may be replaced with a solid-state electrolyte (SSE) (not shown) that functions as both an electrolyte and a separator. The SSE may be disposed between the positive electrode 24 and negative electrode 22. The SSE facilitates transfer of lithium ions, while mechanically separating and providing electrical insulation between the negative and positive electrodes 22, 24. By way of non-limiting example, SSEs may include $LiTi_2(PO_4)_3$, $LiGe_2(PO_4)_3$, $Li_7La_3Zr_2O_{12}$, $Li_{3x}La_{2/3-x}TiO_3$, $Li_3PO_4$, $Li_3N$, $Li_4GeS_4$, $Li_{10}GeP_2S_{12}$, $Li_2S$—$P_2S_5$, $Li_6PS_5Cl$, $Li_6PS_5Br$, $Li_6PS_5I$, $Li_3OCl$, $Li_{2.99}Ba_{0.005}ClO$, or combinations thereof.

The positive electrode 24 may be formed from a lithium-based active material that can sufficiently undergo lithium intercalation and deintercalation, or alloying and dealloying, while functioning as the positive terminal of the battery 20. One exemplary common class of known materials that can be used to form the positive electrode 24 is layered lithium transitional metal oxides. For example, in certain aspects, the positive electrode 24 may comprise one or more materials having a spinel structure, such as lithium manganese oxide ($Li_{(1+x)}Mn_2O_4$, where $0.1 \leq x \leq 1$), -lithium manganese nickel oxide ($LiMn_{(2-x)}Ni_xO_4$, where $0 \leq x \leq 0.5$) (e.g., $LiMn_{1.5}Ni_{0.5}O_4$); one or more materials with a layered structure, such as lithium cobalt oxide ($LiCoO_2$), lithium nickel manganese cobalt oxide ($Li(Ni_xMn_yCo_z)O_2$, where $0 \leq x \leq 1$, $0 \leq y \leq 1$, $0 \leq z \leq 1$, and $x+y+z=1$) (e.g., $LiMn_{0.33}Ni_{0.33}Co_{0.33}O2$), or a lithium nickel cobalt metal oxide ($LiNi_{(1-x-y)}Co_xM_yO_2$, where $0<x<0.2$, $y<0.2$, and M may be Al, Mg, Ti, or the like); or a lithium iron polyanion oxide with olivine structure, such as lithium iron phosphate ($LiFePO_4$), lithium manganese-iron phosphate ($LiMn_{2-x}Fe_xPO_4$, where $0<x<0.3$), or lithium iron fluorophosphate ($Li_2FePO_4F$).

In certain variations, the positive electroactive materials may be intermingled with an electronically conducting material that provides an electron conduction path and/or at least one polymeric binder material that improves the structural integrity of the electrode. For example, the electroactive materials and electronically or electrically conducting materials may be slurry cast with such binders, like polyvinylidene difluoride (PVdF), polytetrafluoroethylene (PTFE), ethylene propylene diene monomer (EPDM) rubber, or carboxymethyl cellulose (CMC), a nitrile butadiene rubber (NBR), styrene-butadiene rubber (SBR), lithium polyacrylate (LiPAA), sodium polyacrylate (NaPAA), sodium alginate, lithium alginate. Electrically conducting materials may include carbon-based materials, powdered nickel or other metal particles, or a conductive polymer. Carbon-based materials may include, for example, particles of graphite, acetylene black (such as KETCHEN™ black or DENKA™ black), carbon fibers and nanotubes, graphene, and the like. Examples of a conductive polymer include polyaniline, polythiophene, polyacetylene, polypyrrole, and the like. In certain aspects, mixtures of the conductive materials may be used. The positive electrode current collector 34 may be formed from aluminum (Al) or any other appropriate electrically conductive material known to those of skill in the art.

The negative electrode 22 includes an electroactive material as a lithium host material capable of functioning as a negative terminal of a lithium ion battery. The negative electrode current collector 32 may comprise a metal comprising copper, nickel, or alloys thereof or other appropriate electrically conductive materials known to those of skill in the art. In certain aspects, the positive electrode current collector 34 and/or negative electrode current collector 32 may be in the form of a foil, slit mesh, and/or woven mesh.

In certain aspects, the present disclosure provides methods of making negative electrodes 22 (e.g., anodes) that incorporate improved electrochemically active negative electrode materials. As discussed above, the negative electroactive materials suffer from significant volumetric expansion during lithium cycling (e.g., capable of accepting the insertion of lithium ions during charging of the electrochemical cell via lithiation or "intercalation" and releasing lithium ions during discharging of the electrochemical cell via delithiation or "deintercalation" or lithium alloying/dealloying). Such an electrochemically active negative electrode material may be selected from the group consisting of: silicon, silicon-containing alloys, tin-containing alloys, and combinations thereof. By way of example, electroactive material particles comprising silicon may include silicon, or silicon containing binary and ternary alloys and/or tin-containing alloys, such as Si—Sn, SiSnFe, SiSnAl, SiFeCo, $SnO_2$, and the like. In accordance with various aspects of the present teachings, a negative electroactive material can be incorporated into a negative electrode in an electrochemical cell.

Furthermore, in a typical manufacturing process, a negative electrode material is incorporated into the electrochemical cell without any lithium. The positive electrode has lithium and after cycling the electrochemical cell, lithium passes into and lithiates the negative electrode. However, in negative electroactive materials including silicon, for example, a portion of the lithium may not cycle back through the electrolyte to the positive electrode, but instead may remain with the negative electrode following the first lithiation cycle. This may be due to for example, formation of $Li_xSi$ and/or a solid electrolyte interphase (SEI) layer on the negative electrode, as well as ongoing lithium loss due to continuous solid electrolyte interphase (SEI) breakage. The solid electrolyte interface (SEI) layer can form over the surface of the negative electrode (anode), which is often generated by reaction products of anode material, electrolyte reduction, and/or lithium ion reduction. Such permanent loss of lithium ions may result in a decreased specific energy and power in the battery resulting from added positive electrode mass that does not participate in the reversible operation of the battery. For example, the lithium-ion battery may experience an irreversible capacity loss of greater than or equal to about 5% to less than or equal to about 30% after the first cycle.

Lithiation, for example pre-lithiation of the electroactive materials prior to incorporation into an electrochemical cell, may compensate for such lithium losses during cycling. Common lithiation methods, such as electrochemical, direct contact, and lamination methods; however, often require half-cell fabrication and teardown and/or high temperature chemical processes. Furthermore, it can be difficult to control an extent of lithiation that occurs during these processes. Further, these processes involve highly reactive chemicals and require additional manufacturing steps. These may be time consuming and potentially expensive processes. Further, such processes also commonly produce unworkable materials, for example anodes having undesirable thicknesses. The present disclosure provides improved electroactive and electrode materials, and methods of making the same, which can address these challenges.

In various aspects, the present disclosure provides advantages, including reducing mechanical stress in negative electrodes by forming pre-lithiated negative electroactive materials comprising silicon prior to forming the electrode. Notably, the electroactive materials are both formed and pre-lithiated in a single process. Further, the active lithium loss during formation cycles can be significantly reduced by the present technology. Additionally, cycle life performance of lithium ion batteries incorporating negative electrodes with negative electroactive materials comprising pre-lithiated silicon is improved in accordance with certain aspects of the present disclosure.

Thus, in accordance with certain aspects of the present disclosure, methods are provided for making a negative electrode material for an electrochemical cell that cycles lithium ions, as described above. The method may be a multi-step process for creating pre-lithiated electroactive material particles, like lithiated silicon alloys. These pre-lithiated electroactive material particles may further have one or more coatings applied. In certain aspects, lithiation of silicon by direct reaction can be expressed by: $4.4xLi+ Si \rightarrow Li_{4.4x}Si$, where $0 \leq x \leq 1$, while for electrochemical lithiation of silicon, it can be expressed as $4.4xLi^+ + 4.4xe^{-+} Si \rightarrow Li_{4.4x}Si$. In certain variations, the electroactive materials that are pre-lithiated in accordance with certain aspects of the present disclosure may be lithium silicon alloys represented by $Li_{4.4x}Si$, where $0 \leq x \leq$ about 0.85.

The present disclosure contemplates a method of making lithiated silicon electroactive materials by a centrifugal/gas atomization process. In centrifugal atomization processing, a molten material is directed towards at least one rotating disc or cup, where melt drops form and fly away from the rotating disc or cup to solidify and form spherical particles. Thus, in certain aspects, a method of making a negative electrode material for an electrochemical cell that cycles lithium ions is provided. The method comprises centrifugally distributing a molten precursor comprising silicon and lithium by contacting the molten precursor with a rotating surface in a centrifugal atomizing reactor and solidifying the molten precursor to form a plurality of substantially round solid electroactive particles comprising an alloy of lithium and silicon and having a D50 diameter of less than or equal to about 20 micrometers. In certain variations, the centrifugal atomization process forms a plurality of particles having a relatively small particle size (e.g., ultrafine particles) with a smaller particle size distribution (e.g., monodisperse).

Figure 2:
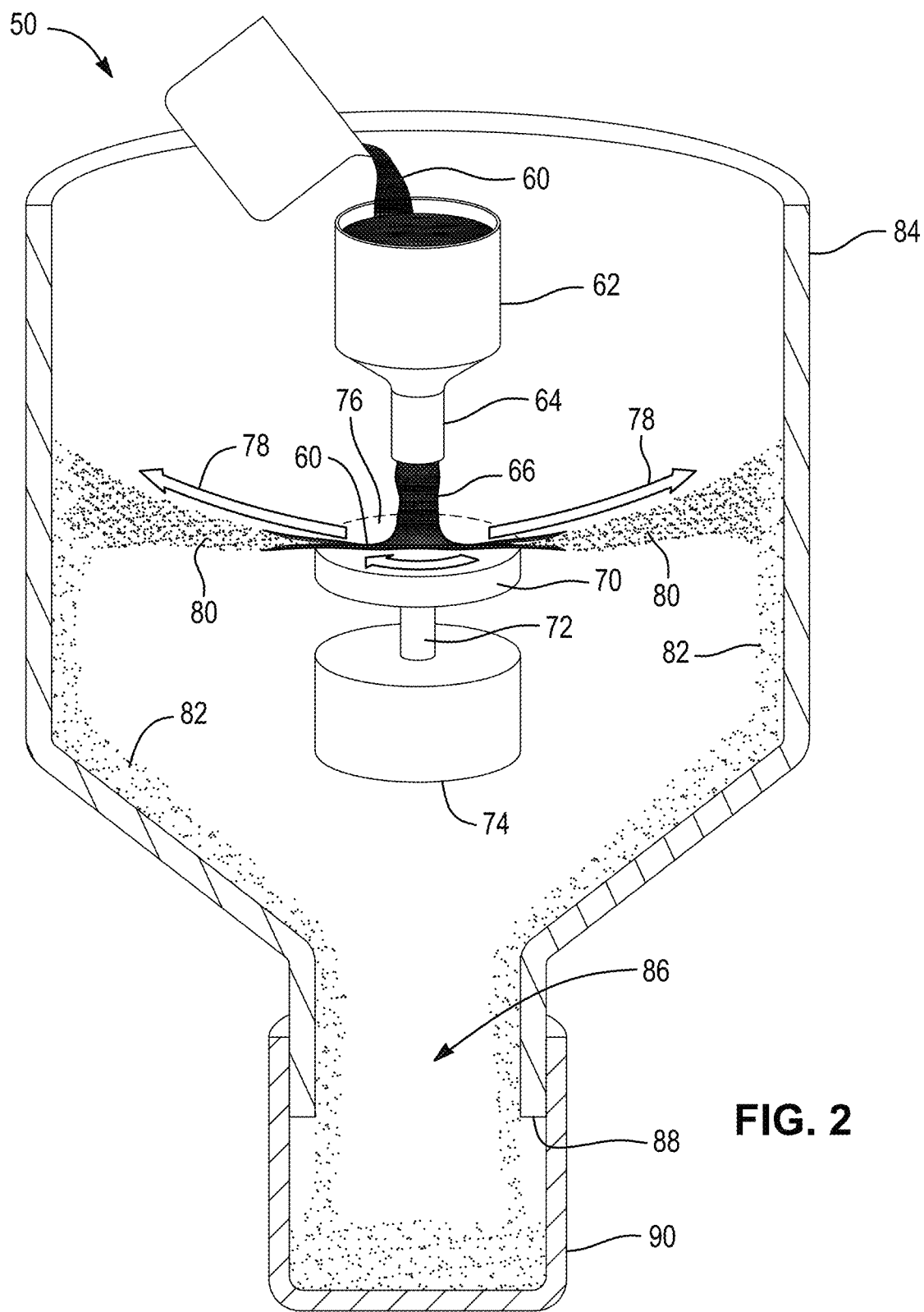
FIG. 2 shows an exemplary centrifugal atomizing reactor used in accordance with the present disclosure to form ultrafine solid electroactive material particles.

FIG. 2 shows an exemplary centrifugal atomizing reactor 50. It should be noted that the reactor 50 is a simplified version and may contain various other equipment. One suitable multistage centrifugal atomizing reactor suitable for forming the plurality of electroactive particles is described in U.S. patent application Ser. No. 16/681,321 filed on Nov. 12, 2019 entitled "Article for Producing Ultra-Fine Powders and Method of Manufacture Thereof," the relevant portions of which are incorporated herein by reference. A molten precursor material 60 can be conveyed in batches or continuously from an upstream furnace and introduced to a distribution vessel or tundish 62. The tundish 62 has at least one outlet port 64 with a suitable diameter to facilitate a quick discharge of the molten precursor material 60. The number and the diameter of the outlet ports 64 may be adjusted to control particle size during and after atomization process, as appreciated by those of skill in the art. Further, the tundish 62 may rotate or have a source of pressure to enhance discharge via the outlet port 64. A stream 66 of molten precursor material 60 is discharged from the outlet port 64.

The stream 66 contacts a surface 76 of a rotating component 70 that may be in the form of a disc or cup. The rotating component 70 is in rotary communication with a shaft 72 and a motor 74. Rotary motion is transmitted from the motor 74 via the shaft 72 to the rotating component 70. The rotary motion of the rotating component 70 imparts a centrifugal force to the molten precursor material 60, which causes it to distribute and comminute the precursor material in a centrifugal direction 78 in the reactor 50 outwards from the central axis defined by the shaft 72. As shown, the molten precursor material 60 contacts the rotating surface 76 and as it passes in an outward direction creates droplets 80 that solidify to form a plurality of substantially round solid electroactive particles 82. While not shown, ultrasonic or mechanical vibration may be applied to the rotating component 70 to facilitate comminution of the molten material as well as de-agglomeration of particles. The droplets 80 are thrust outward. The solid particles 82 are outwardly thrust towards a wall 84 of the reactor 50 and then fall into an outlet region 86 that includes an outlet 88. The ultrafine solid particles 82 are transported by gravity to the outlet 88. As shown, a collection vessel 90 is connected to the outlet 88 and collects the particles 82; however, as will be described in detail below, the outlet 88 alternatively may be in fluid communication with additional reactor chambers.

The solidified particles formed by such a process may be relatively small (e.g., fine or ultrafine) and have a substantially round shape. "Substantially round-shaped" includes particles having low aspect ratios and with a morphology or shape including spherical, orbed, spheroidal, egg-shaped, elliptical, and the like. In certain variations, the particles have a spherical shape. Further, the solid particles may have an average diameter (D). A D50 means a cumulative 50% point of diameter (or 50% pass particle size) for the plurality of solid particles. In certain aspects, the D50 of the plurality of electroactive solid particles formed by a centrifugal atomization process is less than or equal to about 20 micrometers, optionally less than or equal to about 15 micrometers, optionally less than or equal to about 10 micrometers, and optionally less than or equal to about 5 micrometers. In certain variations, the D50 for the plurality of solid electroactive particles formed may be greater than or equal to about 1 μm to less than or equal to about 20 optionally greater than or equal to about 1 μm to less than or equal to about 10 μm.

Figure 4:
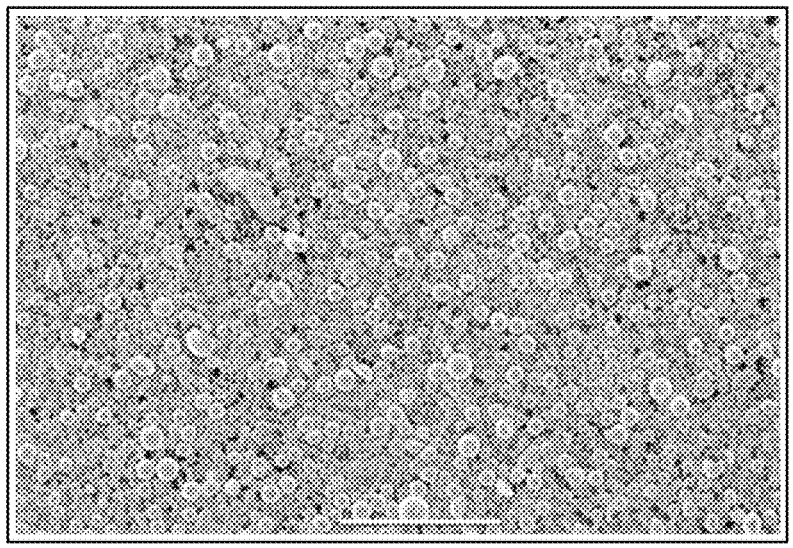
FIG. 4 is a scanning electron microscopy (SEM) image of atomized spherical particles formed via a centrifugal atomization process, where the scale bar is 500 micrometers.

The plurality of electroactive solid particles formed by a centrifugal atomization process may be relatively monodisperse, for example, having a narrow polydispersity index or variation in particle sizes among the plurality of particles formed. In one aspect, the particle distribution is narrow having a polydispersity index of less than or equal to about 1.2, for example. FIG. 4 shows uniform atomized spherical particles formed by a centrifugal atomization process, where the scale bar is 500 In certain aspects, the centrifugal atomization process of forming the plurality of electroactive materials may provide a high yield for the target or predetermined particle size diameter range. For example, where an average particle diameter is selected to be greater than or equal to about 1 μm to less than or equal to about 20 an overall yield from the process for solid particles having the predetermined size range may be greater than or equal to about 10% to less than or equal to about 90%. These uniform diameter electroactive materials formed from an alloy of lithium and silicon may be used in various electrochemical cells/batteries and energy storage devices.

In certain variations, an environment in the centrifugal atomizing reactor may be substantially free of gaseous oxygen-containing species to avoid reaction with lithium. For example, the environment may have less than or equal to about 0.5% by weight of any oxygen-bearing species in a gas phase, for example, oxygen gas, water, and the like. The environment in the reactor optionally has a low water/moisture level reflected by a relative humidity (RH) of less than or 0.5% at reaction condition temperatures.

The centrifugal atomizing reactor may be capable of high throughput, for example, having a mass flow rate of greater than or equal to 50 kg/hour to less than or equal to about 500 kg/hour in forming the particles of electroactive materials with the desired range of average particle sizes. Higher flow rates may also be possible, so long as the particles formed have the desired D50. The flow rate has an effect on particle size. For example, the higher the flow rate of the molten material, the larger size of the particles that are produced. So the flow rate may be limited by the desired size of the particles.

Furthermore, the methods provided by certain aspects of the present disclosure advantageously provide a high level of control over the compositions of the electroactive materials formed. The methods of the present disclosure provide an ability to directly manufacture a pre-lithiated electroactive material comprising silicon, without the need for an initial formation step for the particle followed by a pre-lithiation step where lithium is introduced to the material. As noted above, the alloy comprising lithium and silicon that is formed by the present methods may be represented by the formula: $Li_{4.4x}Si$, where 0≤x≤about 0.85. The precursor material for forming the electroactive material alloy can be selected to have specific compositions that may form specific phases, depending on the temperature conditions selected during the centrifugal atomizing process in the reactor. Thus, precise control of the phases present in the particles formed can be attained through the composition of the melt.

Figure 3:
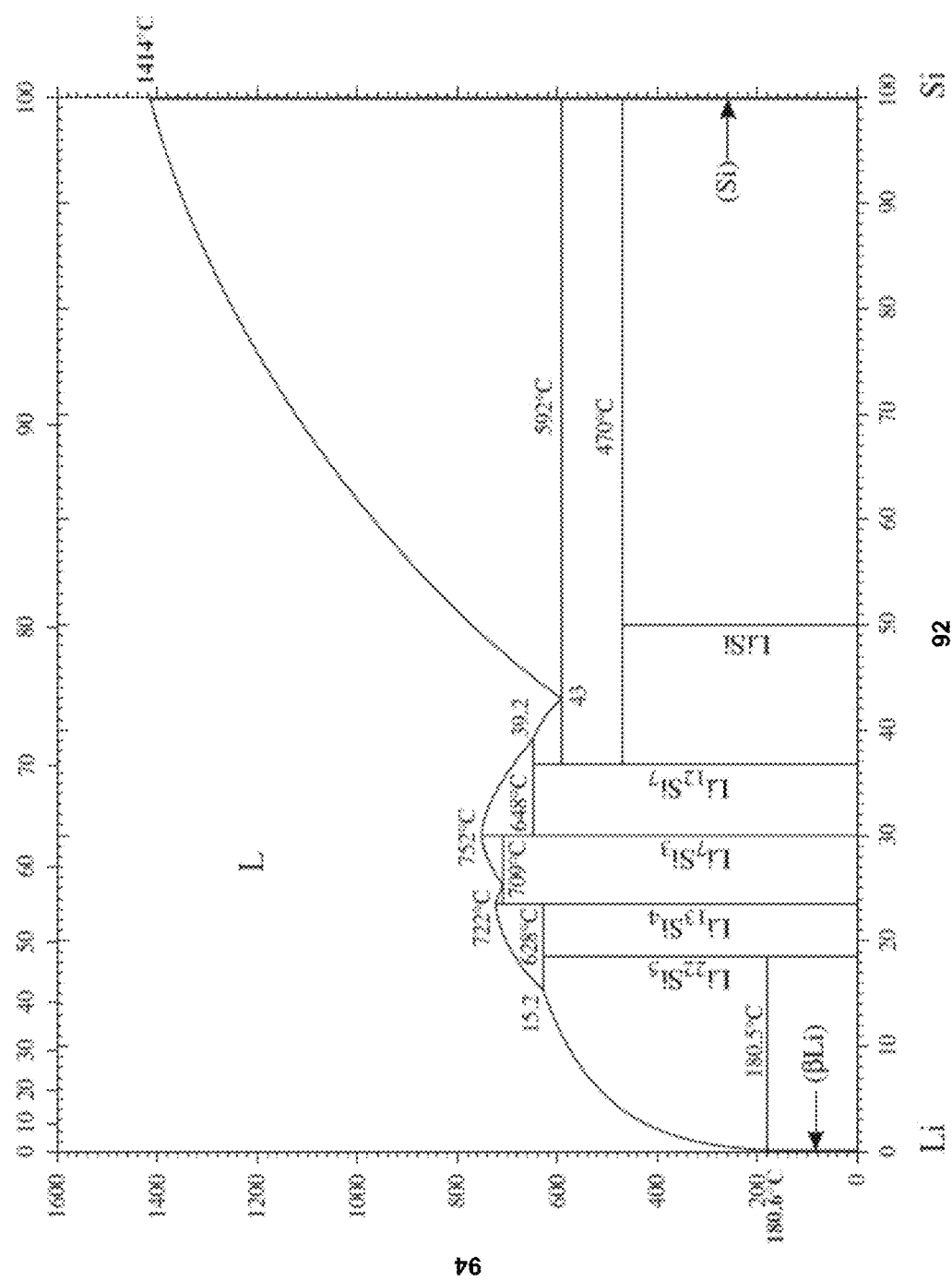
FIG. 3 is a lithium-silicon alloy phase diagram.

A lithium-silicon binary phase diagram is shown in FIG. 3. A first x-axis 92 shows atomic percentage of silicon. A γ-axis 94 shows temperature in ° C. In certain aspects, the precursor material is selected to have greater than 0 atomic % to less than or equal to about 82 at. % of lithium and correspondingly greater than or equal to about 18 atomic % to less than or equal to about 100 at. % of silicon, which generally corresponds to $Li_{4.4x}Si$, where x is greater than 0 to less than or equal to about 0.85. In other aspects, the precursor material optionally has greater than or equal to about 30 atomic % to less than or equal to about 70 at. % of lithium and correspondingly greater than or equal to about 30 atomic % to less than or equal to about 70 at. % of silicon, which generally corresponds to $Li_{4.4x}Si$, where x is greater than or equal to about 0.1 to less than or equal to about 0.5. In yet other aspects, the precursor material optionally has about 50 at. % of lithium and correspondingly greater than or equal to about 50 at. % of silicon, which generally corresponds to $Li_{4.4x}Si$, where x is about 0.25.

In certain aspects, the alloy formed after the centrifugal atomization process may comprise one or more of the following phases: $Li_{22}Si_5$, $Li_{13}Si_4$, $Li_7Si_3$, $Li_{12}Si_7$, LiSi, and Si. Notably, in certain variations where a lower amount of lithium is present in the alloy, a phase comprising only Si may be present. In certain variations, the alloy may comprise one or more of the following phases: $Li_{22}Si_5$, $Li_{13}Si_4$, $Li_7Si_3$, $Li_{12}Si_7$, and LiSi. As will be appreciated by those of skill in the art, it can be desirable to maximize a relative stoichiometric amount of lithium in the lithium-silicon alloy/electroactive material. In certain aspects, a temperature in the centrifugal atomizing reactor during centrifugal distribution of a molten precursor may be greater than or equal to 400° C. to less than or equal to about 1,000° C. Higher temperatures may be employed where the lithium and silicon precursors are miscible, to facilitate formation of the desired phases reflected in the phase diagram in FIG. 3. In certain variations, a temperature in the centrifugal atomizing reactor during centrifugal distribution of a molten precursor may be greater than or equal to 400° C. to less than or equal to about 800° C. Compared to other pre-lithiation methods, centrifugal/gas atomization provided by certain aspects of the present disclosure provides a means to precisely control the extent of pre-lithiation and phases formed.

Thus, in various aspects, a centrifugal/gas atomizer reactor is used to produce particles that comprise pre-lithiated silicon alloys. Such a centrifugal/gas atomizer reactor provides high throughput production of lithium-silicon alloy electroactive particles having a relatively homogenous size distribution and thus, a high yield for a predetermined average particle size diameter. The $Li_{4.4x}Si$ alloy can reduce the lithium consumption and initial stress during formation cycles. This has the benefit of the electroactive material comprising silicon undergoing an initial volumetric expansion due to lithiation prior to being incorporated into an electrode to enhance the mechanical properties of the electrode that is initially formed. Conventionally, the electroactive material comprising silicon is incorporated into an electrode (e.g., mixed in with the polymeric matrix and other electrode components) and then lithiated where the initial expansion occurs. This expansion upon lithiation can cause mechanical stress and potential damage to not only the electroactive particles, but also the surrounding composite. When electroactive materials are formed from the lithium and silicon alloys in accordance with the present disclosure, they have already undergone an initial volumetric expansion and thus incorporating them into an electrode only causes minimal expansion and contraction stress during lithium cycling.

Furthermore, in accordance with certain aspects of the present disclosure, the lithium-silicon alloy powder created by the centrifugal/gas atomization process can then be coated with one or more coatings to protect the underlying electroactive material and/or increase the electrical conductivity. Moreover, the lithium-silicon alloy particles can be exposed to a liquid electrolyte to form a surface solid electrolyte interface (SEI) layer before the electrode is fabricated.

Figure 5:
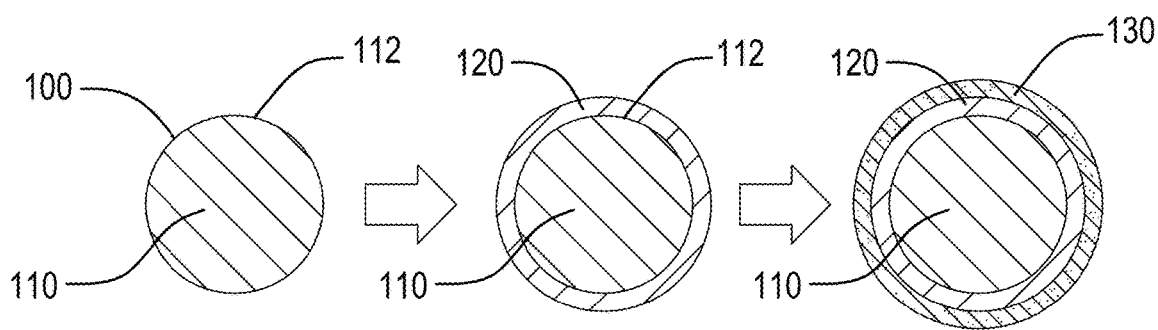
FIG. 5 is an illustration of a cross-sectional view of a negative electroactive material particle formed in accordance with certain aspects of the present disclosure, including a lithium-silicon alloy negative electroactive particle that can be treated to have a first coating and optionally further treated to have a second coating.

For example, as shown in FIG. 5, a negative electroactive particle 100 comprising a lithium-silicon alloy electroactive forms a core region 110, which while already expanded during an initial lithiation process, may undergo additional volume expansion during lithium cycling, for example, during lithium ion intercalation or lithium alloying. For example, the lithium-silicon alloy in the core region 110 may have a composition of $Li_{4.4x}Si$, where x may range from greater than 0 to less than or equal to about 0.85, which due to prelithiation is in a substantially expanded state. For a conventional silicon electroactive material, the extent of volumetric expansion that occurs during an initial lithiation reaction can cause the silicon particle to mechanically degrade and break into a plurality of smaller fragments or pieces. When the particle breaks into smaller pieces, additional lithium is consumed to form new SEI and these fragments or smaller pieces can no longer maintain performance of the electrochemical cell.

The negative electroactive particle 100 includes the core region 110 having a surface 112. It should be noted that the features in FIG. 5 are not necessarily shown to scale, but rather are merely provided for purposes of illustration. The negative electroactive particle 100 may have the dimensions specified above. An optional first coating 120 is disposed over the surface 112. In certain variations, a negative electroactive particle 100 having the core region 110 comprising the lithium-silicon alloy and a first coating 120 may be incorporated into a negative electrode. However, in certain other variations, a multilayered coating may be formed over the negative electroactive particle 100. Thus, a second coating 130 may be disposed over the first coating 120 and the core region 110. This negative electroactive particle having the multilayered coating including the first coating 120 and second coating 130 may be incorporated into a negative electrode. It should be noted that more than two layers of coatings may be applied or formed on the negative electroactive particle 100.

In certain aspects, at least one of the first coating 120 or the second coating 130 may be an electrically conductive and ionically conductive layer that comprises a carbon-containing or carbonaceous material. In certain aspects, the electrically conductive and ionically conductive layer may comprise an amorphous carbon that generally lacks any crystalline structure or ordering. Amorphous carbon generally has superior mechanical properties, such as tensile strength, for withstanding the volumetric changes of the electroactive material. Further, the electrically conductive and ionically conductive layer may also comprise a graphitic carbon, which is crystalline and has ordering. As will be described further below, graphitic carbon exhibits good electrical conductivity. Generally, the graphitic carbon may have an sp2/sp3 ratio of bonds ranging from about 70:30 to about 100:1. In an example, the ratio of $sp^2$ carbon to $sp^3$ carbon in the carbon coating may be about 74 to about 26. Such an electrically conductive and ionically conductive layer can be formed in a pyrolysis process. In certain variations, the amorphous carbon may form a first layer within the first or second coatings 120, 130 and the graphitic carbon may form a second layer within the first or second coatings 120, 130. However, there may not be a distinct compositional delineation between the layers, but rather a gradient region between the respective compositions that defines the coating. An outer region of the first or second coatings 120, 130 may comprise graphitic carbon to provide good electrical conductivity, including good connection between adjacent electroactive particles.

Figure 6:
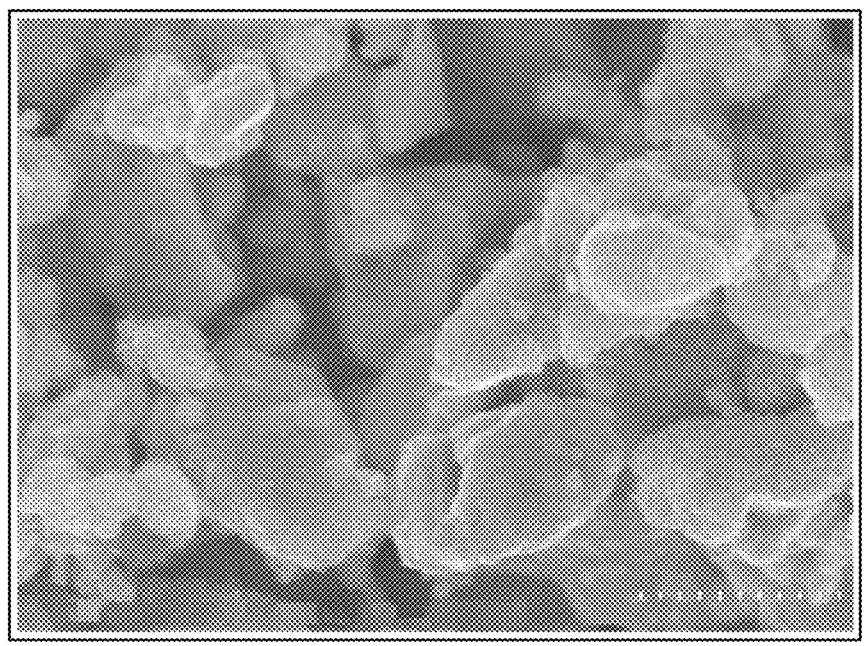
FIG. 6 is a scanning electron microscopy (SEM) image of electroactive particles including a first carbon containing of a carbonaceous material, where the scale bar is 3 micrometers.

In certain variations, the electrically conductive and ionically conductive layer comprising carbon may have a thickness corresponding to a size of the electroactive material particle. For example, the coated negative electroactive particle 100 may have greater than or equal to about 1% to less than or equal to about 50% by weight of the carbon coating to a weight of the overall particle, including the electroactive material particle 100. In certain variations, the carbon coating may have a thickness of greater than or equal to about 2 nm to less than or equal to about 200 nm; optionally greater than or equal to about 2 nm to less than or equal to about 100 nm, optionally greater than or equal to about 5 nm to less than or equal to about 50 nm, and optionally greater than or equal to about 10 nm to less than or equal to about 50 nm. FIG. 6 is a scanning electron microscopy (SEM) image of silicon-containing electroactive material particles comprising a coating of a carbonaceous material.

In certain other aspects, at least one of the first coating 120 or the second coating 130 may be a mechanically protective ionically conductive layer that comprises an oxide-based coating. By "oxide-based" coating, it is meant that the coating comprises oxygen and is applied with precursors that form an oxygen-containing coating, but such precursors may further react with reactive groups on the surface of the electroactive material to form hybridized compounds. In certain variations, the oxide-based coating comprises an oxide of a metal selected from the group consisting of: aluminum (Al), titanium (Ti), tin (Sn), zirconium (Zr), vanadium (V), hafnium (Hf), zinc (Zn) and combinations thereof. In other variations, the coating may be an oxide-based surface coating selected from the group consisting of: aluminum oxide ($Al_2O_3$), titanium dioxide ($TiO_2$), silicon dioxide ($SiO_2$), vanadium pentoxide ($V_2O_5$), zirconium dioxide ($ZrO_2$), hafnium dioxide ($HfO_2$), tin oxide ($SnO_2$), and zinc oxide (ZnO). It should be noted that the amount of oxygen might vary in the metal oxide coating, as desired, so that an aluminum oxide may not necessarily be stoichiometrically aluminum oxide ($Al_2O_3$) and the like.

Such oxide-based surface coatings may be formed by using one or more precursors for aluminum oxide ($Al_2O_3$), silicon dioxide ($SiO_2$), vanadium pentoxide ($V_2O_5$), titanium dioxide ($TiO_2$), zirconium dioxide ($ZrO_2$), hafnium dioxide ($HfO_2$) and/or zinc oxide (ZnO). In certain variations, the oxide-based surface coating may be selected from the group consisting of: aluminum oxide ($Al_2O_3$), titanium oxide ($TiO_2$), zinc oxide (ZnO) and silicon oxide ($SiO_2$), in certain variations. In certain variations, the oxide-based surface coating comprises aluminum oxide ($Al_2O_3$). Such an oxide-based surface coating may be formed by using one or more precursors for an aluminum oxide ($Al_2O_3$) coating, as will be further described herein.

In certain variations, a thickness of the oxide-based coating applied to the electroactive material is less than or equal to about 200 nm, optionally less than or equal to about 150 nm, optionally less than or equal to about 100 nm, optionally less than or equal to about 75 nm, optionally less than or equal to about 50 nm, optionally less than or equal to about 40 nm, optionally less than or equal to about 30 nm, optionally less than or equal to about 20 nm, optionally less than or equal to about 15 nm, optionally less than or equal to about 10 nm, and in certain variations, optionally less than or equal to about 5 nm. In certain variations, the oxide-based coating has a thickness of greater than or equal to about 3 nm to less than or equal to about 50 nm.

In certain variations, where both the first coating 120 and the second coating 130 are present on the negative electroactive particle 100, an overall total thickness of the multiple coatings may be greater than or equal to about 5 nm to less than or equal to about 400 nm; optionally greater than or equal to about 10 nm to less than or equal to about 300 nm, optionally greater than or equal to about 10 nm to less than or equal to about 200 nm, and optionally greater than or equal to about 10 nm to less than or equal to about 100 nm.

In certain variations, the first coating 120 may comprise a carbonaceous material, which may be a multilayered coating as described above, including graphitic and amorphous carbon. This electroactive material particle comprising the lithium-silicon alloy and having the carbon-based first coating 120 may be incorporated directly into a negative electrode. Alternatively, the negative electroactive material particle having the first coating 120 comprising a carbonaceous material may further include the second coating 130 comprising an oxide-based material.

In another variation, the first coating 120 may comprise an oxide-based coating. This negative electroactive material particle comprising the lithium-silicon alloy and having the oxide-based first coating 120 may be incorporated directly into a negative electrode. Alternatively, the negative electroactive material particle having the first coating 120 comprising an oxide-based coating may further have the second coating 130 comprising a carbonaceous material, which may be a multilayered coating as described above, including graphitic and amorphous carbon. Again, the negative electroactive material comprising the lithium-silicon alloy and having the oxide-based first coating 120 and the carbon-containing second coating 130 may be incorporated into a negative electrode.

Negative composite electrodes may comprise greater than or equal to about 50% to less than or equal to about 90% of an electroactive material (e.g., lithium-silicon alloy containing particles optionally having one or more coatings prepared in accordance with the present disclosure), optionally greater than or equal to about 5% to less than or equal to about 30% of an electrically conductive material, and a balance binder. Electrically conductive materials are well known in the art and include graphite, carbon black, carbon nanotubes, powdered nickel, conductive metal particles, conductive polymers, and combinations thereof. Useful binders include any of those described above. For example, useful binders may comprise a polymeric material and extractable plasticizer suitable for forming a bound porous composite, such as halogenated hydrocarbon polymers (such as poly(vinylidene chloride) and poly((dichloro-1,4-phenylene)ethylene), fluorinated urethanes, fluorinated epoxides, fluorinated acrylics, copolymers of halogenated hydrocarbon polymers, epoxides, ethylene propylene diamine termonomer (EPDM), ethylene propylene diamine termonomer (EPDM), polyvinylidene difluoride (PVDF), hexafluoropropylene (HFP), ethylene acrylic acid copolymer (EAA), ethylene vinyl acetate copolymer (EVA), EAA/EVA copolymers, PVDF/HFP copolymers, carboxy methyl cellulose (CMC), and mixtures thereof.

An electrode may be made by mixing the electrode active material, such as coated lithium-silicon alloy containing powder or particles, into a slurry with a polymeric binder compound, a non-aqueous solvent, optionally a plasticizer, and optionally if necessary, electrically conductive particles. The slurry can be mixed or agitated, and then thinly applied to a substrate via a doctor blade. The substrate can be a removable substrate or alternatively a functional substrate, such as a current collector (such as a metallic grid or mesh layer) attached to one side of the electrode film. In one variation, heat or radiation can be applied to evaporate the solvent from the electrode film, leaving a solid residue. The electrode film may be further consolidated, where heat and pressure are applied to the film to sinter and calendar it. In other variations, the film may be air-dried at moderate temperature to form self-supporting films. If the substrate is removable, then it is removed from the electrode film that is then further laminated to a current collector. With either type of substrate, it may be necessary to extract or remove the remaining plasticizer prior to incorporation into the battery cell.

A battery may thus be assembled in a laminated cell structure, comprising an anode layer, a cathode layer, and electrolyte/separator between the anode and cathode layers. The anode and cathode layers each comprise a current collector. A negative anode current collector may be a copper collector foil, which may be in the form of an open mesh grid or a thin film. The current collector can be connected to an external current collector tab.

For example, in certain variations, an electrode membrane, such as an anode membrane, comprises the electrode active material (e.g., coated lithium-silicon alloy containing particles) dispersed in a polymeric binder matrix over a current collector. The separator can then be positioned over the negative electrode element, which is covered with a positive electrode membrane comprising a composition of a finely divided lithium insertion compound in a polymeric binder matrix. A positive current collector, such as aluminum collector foil or grid completes the assembly. Tabs of the current collector elements form respective terminals for the battery. A protective bagging material covers the cell and prevents infiltration of air and moisture. Into this bag, a liquid electrolyte may be injected into the separator (and may be imbibed into the positive and/or negative electrodes) suitable for lithium ion transport. In certain aspects, the laminated battery is further hermetically sealed prior to use.

A surface coating (such as an oxide-based coating) applied to a negative electroactive material comprising a lithium-silicon alloy in accordance with certain aspects of the present technology may be formed over the entire exposed surface and thus serve as an artificial solid electrolyte interface layer, which can protect the electrode from reaction with liquid electrolyte. In various aspects, the electroactive materials comprising lithium-silicon alloys may have a surface coating providing certain advantages, such as high cut voltage (e.g., cut-off potentials relative to a lithium metal reference potential) that desirably minimizes or avoids SEI formation. In certain aspects, a lithium-ion battery incorporating an inventive negative electroactive material having a lithium-silicon alloy electroactive material with optional coating(s) substantially maintains charge capacity (e.g., performs within a preselected range or other targeted high capacity use) for at least about 1,000 hours of battery operation, optionally greater than or equal to about 1,500 hours of battery operation, optionally greater than or equal to about 2,500 hours or longer of battery operation, and in certain aspects, optionally greater than or equal to about 5,000 hours or longer (active cycling).

In certain aspects, the lithium-ion battery incorporating an inventive negative electroactive/electrode material having a lithium-silicon alloy electroactive material with optional coating(s) maintains charge capacity and thus is capable of operating within 20% of target charge capacity for a duration of greater than or equal to about 2 years (including storage at ambient conditions and active cycling time), optionally greater than or equal to about 3 years, optionally greater than or equal to about 4 years, optionally greater than or equal to about 5 years, optionally greater than or equal to about 6 years, optionally greater than or equal to about 7 years, optionally greater than or equal to about 8 years, optionally greater than or equal to about 9 years, and in certain aspects, optionally greater than or equal to about 10 years.

In other aspects, the lithium-ion battery incorporating an inventive electroactive material is capable of operating at less than or equal to about 30% change in a preselected target charge capacity (thus having a minimal charge capacity fade), optionally at less than or equal to about 20%, optionally at less than or equal to about 15%, optionally at less than or equal to about 10%, and in certain variations optionally at less than or equal to about 5% change in charge capacity for a duration of at least about 100 deep discharge cycles, optionally at least about 200 deep discharge cycles, optionally at least about 500 deep discharge cycles, optionally at least about 1,000 deep discharge cycles.

Stated in another way, in certain aspects, a lithium-ion battery or electrochemical cell incorporating the inventive negative electroactive material having a lithium-silicon alloy electroactive material with optional coating(s) substantially maintains charge capacity and is capable of operation for at least about 1,000 deep discharge cycles, optionally greater than or equal to about 2,000 deep discharge cycles, optionally greater than or equal to about 3,000 deep discharge cycles, optionally greater than or equal to about 4,000 deep discharge cycles, and in certain variations, optionally greater than or equal to about 5,000 deep discharge cycles.

The present disclosure thus contemplates methods of forming the carbon-containing coatings and/or oxide-containing coatings on the negative electroactive materials comprising lithium-silicon alloys. The carbon-containing coating can be formed in a pyrolysis process where a hydrocarbon is reduced to form a carbonaceous coating. The process for applying the oxide-based surface coating may be selected from a group consisting of atomic layer deposition (ALD), chemical vapor infiltration, chemical vapor deposition, physical vapor deposition, wet chemistry, and any combinations thereof. Indeed, in certain aspects, a deposition process may first comprise applying a carbon material to one or more surfaces of the electrode material by a first process, followed by applying a metal oxide material in a second process, or vice versa. Furthermore, in certain variations, a first coating may comprise an oxide-based coating, a second coating may comprise a carbon-based coating, and a third coating may comprise an oxide-based coating.

In certain aspects, the first and second processes may be in the same type of process or equipment, but the deposition or applying steps are carried out separately (e.g., sequentially). As will be described further herein, the first and second coating processes may be conducted in downstream reaction chambers in fluid communication with the centrifugal atomization reactor. In other aspects, the first and second processes may be entirely distinct from one another and/or further conducted separately after the formation of the negative electroactive lithium-silicon alloy particles in the centrifugal atomization reactor.

In certain aspects, the coating processes may occur all in gas phase reactor chambers, where gas phase reactions occur on the surface of the solid electroactive material powder. FIG. 7 shows one example of an reactor system 200 including a centrifugal atomizing reactor 210 integrated and in fluid communication with distinct downstream reactor chambers for gas phase coating of the electroactive material particles in accordance with certain aspects of the present disclosure. The centrifugal atomizing reactor 210 has a similar design to the centrifugal atomizing reactor 50 described in the context of FIG. 2, so unless otherwise discussed, for brevity the components will not be described again here. A molten precursor material 212 is introduced to a distribution vessel or tundish 214. The tundish 214 has at least one outlet port 216 that discharges the molten precursor material 212.

The molten precursor material 212 contacts a surface of a rotating component 220 rotatably driven by a motor 222. The rotating component 220 imparts a centrifugal force to the molten precursor material 212, which causes it to distribute and comminute the precursor material in a centrifugal direction 218 in the reactor 210. The molten precursor material 212 transforms into droplets 230 that solidify to form a plurality of substantially round solid electroactive solid particles 232. The particles 232 are outwardly thrust towards a wall 234 of the reactor 210 and then fall into an outlet 236.

The outlet 236 is in fluid communication with a first coating reactor 240. The first coating reactor 240 is further in fluid communication with a downstream second coating reactor 260. Thus, the particles 232 are transported by gravity through the outlet 236 into the first coating reactor 240. As noted above, depending on the selection of the composition of the first coating and the second coating, different coating precursor materials and reactions can be conducted in each of the first coating reactor 240 and the second coating reactor 260. Moreover, in the variations where only one coating is applied, it will be appreciated that only the first coating reactor 240 is connected to the centrifugal atomizing reactor 210.

By way of non-limiting example, the first coating reactor 240 may be used to form a carbon-containing coating. Thus, a pyrolysis step may be conducted in the first coating reactor 240, where a gas phase carbon-containing precursor is injected into one or more injector ports 242 and travels into a first internal reactor chamber 244 of the first coating reactor 240. One or more outlet ports 246 are also in fluid communication with the first internal reactor chamber 244 for removing gas phase products and reactants. The carbon-containing precursor thus mixes with the particles 232 in the first internal reactor chamber 244. The carbon-containing precursor is pyrolyzed to form a continuous carbon coating on the surfaces of each particle 232. The pyrolyzing serves as a deposition and carbonization process. In certain variations, gas phase reactions are employed to form the coatings on the negative electroactive material particles 232. Thus, the carbon-containing precursor may be in a gas phase. In certain variations, the carbon-containing precursor comprises a hydrocarbon gas selected from the group consisting of: methane ($CH_4$), ethane ($C_2H_6$), propane ($C_3H_8$), butane ($C_4H_{10}$), pentane ($C_5H_{12}$), hexane ($C_6H_{14}$), heptane ($C_7H_{16}$), octane ($C_8H_{18}$), acetylene ($C_2H_2$), toluene ($C_7H_8$), natural gas, and combinations thereof. In one variation, the carbon-containing precursor may be methane ($CH_4$) and be present at about 10% by weight of a total atmosphere in the first internal reactor chamber 244 with a balance being inert gases, like argon or helium.

The continuous carbon coating formed comprises both graphitic carbon and amorphous carbon. The pyrolyzing may be conducted at a temperature of greater than or equal to about 600° C. and in certain aspects, optionally at greater than or equal to about 600° C. to less than or equal to about 1,400° C. In certain variations, the temperature may be greater than or equal to about 950° C. to less than or equal to about 1,030° C. The pyrolyzing may be conducted from ambient pressures up to about 30 psi (207 kPa) in the first coating reactor 240. In certain aspects, the duration of the pyrolyzing step is greater than or equal to about 30 minutes to less than or equal to about 600 minutes, optionally greater than or equal to about 60 minutes to less than or equal to about 360 minutes, and in certain aspects, optionally greater than or equal to about 120 minutes to less than or equal to about 240 minutes.

In certain aspects, the carbon deposition during the pyrolysis step in the first coating reactor 240 can be highly controlled. Longer carbon deposition times provide thicker carbon coatings. Further, temperature during the pyrolysis step can be used to control a sp2 to sp3 ratio of the carbon coating formed. Generally, the greater the temperature, the greater the amount of sp2 carbon that is formed. A lower carbonization temperature tends to form more sp3 carbon, which has superior mechanical properties for withstanding the volumetric changes of the electroactive material. A higher temperature also promotes more crystallization of the carbon material, leading to more graphitization of the carbon, which results in greater electrical conductivity. Gas concentration and type of gases can also control the loading of the carbon coating and its composition. Thus, a variety of continuous carbon coatings described previously above can be made by such processes in a highly controlled manner.

As noted above, the carbon layer comprises both amorphous carbon and graphitic carbon, which may be generally separated into regions of the continuous carbon coating over the surface of the electroactive material. An inner layer comprises the amorphous carbon, while an exposed outer layer comprises the graphitic carbon. As will be appreciated by those of skill in the art, the inner layer may also comprise graphitic compounds, but has a majority of amorphous carbon. Likewise, the outer layer may contain amorphous compounds, but is predominantly a graphitic composition. The inner carbon layer comprising amorphous carbon may have a greater thickness than the outer carbon layer comprising graphitic carbon. As the inner layer and the outer layer are formed in the pyrolysis process, as will be further appreciated by those of skill in the art, there may not be a distinct compositional delineation between the layers, but rather an interface region between the respective compositions defining a compositional gradient between regions or layers having different compositions.

In certain aspects, the pyrolyzing may be conducted in the presence of an additive selected from the group consisting of: ammonia ($NH_3$), hydrogen ($H_2$), carbon monoxide (CO), and combinations thereof.

The gas phase first coating reactor 240 in which the electroactive material can be coated with a carbonaceous material may be a fluidized bed reactor, a rotary reactor, a tube furnace, a thermal chamber with gas flows and the like. The first coating reactor 240 may further comprise other components not shown, including heaters, coolers, controllers, flow routing and valves that can control the amount of exposure of the particles 232 to the vapor source. The coating precursor vapor may be pulsed into the deposition chamber on a carrier gas and may be quickly purged, for example, by vacuum pumping or flushing with an inert gas. Such pulsing of the vapor and purging of the system may be performed to control the dose of the precursor vapor to which the substrate is exposed.

After having the first coating comprising a carbon-containing material applied to the electroactive material particles 232 via pyrolysis in the first coating reactor 240, the coated particles 232 then pass into the second coating reactor 260. In certain aspects, the surface coating may be applied in the second coating reactor 260 by an atomic layer deposition (ALD) process that can coat the electroactive material with a conformal layer that comprises the oxide-based layer, such as aluminum oxide ($Al_2O_3$). ALD is a self-limiting process for chemical deposition or growth of ultrathin films on a substrate. ALD typically involves subjecting the target substrate or particles to self-saturating surface reactions. The surface reactions may be conducted sequentially and/or in an alternating fashion, depending on the composition and structure of the film desired.

Where the second coating reactor 260 is an ALD reactor, it may be a vacuum deposition chamber. At least one vapor source (known as the precursor) is introduced through one or more injector ports 262 and then into a second internal reactor chamber 264. One or more outlet ports 266 are also in fluid communication with the second internal reactor chamber 264 for removing gas phase products and reactants. The second coating reactor 260 may include various controls and equipment that is not shown, including pressure control equipment, heaters, coolers, flow routing and valves, by way of non-limiting example. The ALD process for deposition of surface coating onto regions of the particles 232 may involve reaction of the surface in a deposition chamber with a single vapor of precursor materials or reaction of the surface with multiple vapors introduced sequentially and having the precursors of the surface coating. The vapor may be pulsed into the vacuum deposition second internal reactor chamber 264 on a carrier gas and may be quickly purged, for example, by vacuum pumping or flushing with an inert gas. Such pulsing of the vapor and purging of the system may be performed to control the dose of the precursor vapor to which the substrate is exposed.

Suitable vapor precursors for ALD may include organic and inorganic metallic compounds. For an aluminum oxide ($Al_2O_3$) coating, a vapor precursor may be selected from the group consisting of: trimethyl aluminum (TMA (($CH_3)_3Al$)), aluminum fluoride ($AlF_3$), aluminum nitride ((AlN) where the precursor is TMA and ammonia), and the like. In alternative variations, $Al_2O_3$ or any of the other coatings discussed herein can be readily obtained by using different precursors and deposition processes. For a titanium oxide coating ($TiO_2$), the precursor materials may be tetrakis(diethylamido)titanium(IV), tetrakis(dimethylamido)titanium(IV), and/or titanium(IV) isopropoxide, by way of example. For a vanadium pentoxide coating ($V_2O_5$), the metal precursor can be vanadium(V) oxytriisopropoxide, for example. For a zirconium oxide coating ($ZrO_2$), the precursors may be zirconium tetrachloride ($ZrCl_4$) and oxygen ($O_2$). For a hafnium oxide ($HfO_2$), the precursors may be tetrakis(ethylmethylamino)hafnium (TEMAH) and water. For a tin oxide (e.g., $SnO_2$) coating, the ALD precursor materials may be $SnCl_4$, $SnI_4$, Bis[bis(trimethyl silyl)amino] tin (II), Dibutyldiphenyl tin, Hexaphenyl ditin(IV) tetra-allyl tin, tetravinyl tin, trimethyl(phenyl)tin, tin acetylacetonate, or heterocyclic tin with hydrogen peroxide, ozone or water. For a zinc oxide coating (ZnO), the precursor material may be methylzinc isopropoxide. For a silicon oxide coating, the precursor materials can be silicon tetrachloride, tetraethyl orthosilicate, and/or tris(tert-butoxy)silanol, by way of example.

Generally, the ALD process is performed at elevated temperatures and reduced pressures. Temperature within the second internal reactor chamber 264 of the second coating reactor 260 is desirably high enough that reaction between the substrate and the precursors in the vapor occurs, while also preventing condensation of the vapor onto the surface. As non-limiting examples, the reaction space in the second internal reactor chamber 264 may have a temperature of room temperature (e.g., approximately 21° C.) to about 600° C. (for depositing coating on the particles 232), and the operating pressure may be between about $7.5 \times 10^{-2}$ Torr and about 4 Torr (about 1 Pa to about 5000 Pa).

Because of the ALD process and surface reactions, a single atomic layer of the surface coating material may be bound to the electroactive material particle surface, thereby providing a monoatomic coating. With sequential or alternating reactions, multiple layers may be formed. Furthermore, additional atomic monolayers may be grown over the monoatomic layer, thereby forming a surface coating having greater thicknesses.

In one variation, an ALD process can be illustrated by the formation of aluminum oxide ($Al_2O_3$) coatings. An inert gas, like argon may be introduced via the one or more injector ports 262 and then into a second internal reactor chamber 264. A predetermined amount of aluminum, in the form of a suitable volatile precursor compound, such as trimethyl aluminum (TMA $((CH_3)_3Al)$), is introduced as a vapor (for example at a temperature of about 50° C.) and flows into contact with the exposed surfaces of the electroactive material particles 232. The TMA chemisorbs to the particle surface, where methane ($CH_4$) is released as a byproduct and may be removed via the one or more outlet ports 266, as necessary. Typically, reaction of the aluminum-containing material with the surface groups of electroactive material is completed in a short time frame, on the order of a few seconds, for example.

Next, water vapor ($H_2O$, such as high-performance liquid chromatography grade water) may be introduced via one of the injector ports 262 into the second internal reactor chamber 264 to flow over the exposed surface of the particles. The water ($H_2O$) further reacts with the TMA and forms methane ($CH_4$). As such, a first conformal layer of aluminum oxide ($Al_2O_3$) forms on the surface of the particles 232. Excess reactants and byproducts may be removed from the chamber via the outlet ports 266. As will be appreciated, as the particles 232 travel through the second coating reactor 260, precursors and reactants may be introduced sequentially to repeat the growth of an $Al_2O_3$ film layer by layer on the surface of the electroactive material particles 232.

The ALD process is illustrative of one technique for forming aluminum oxide ($Al_2O_3$) coatings on an electrode material, but other processes may also be used to form other coatings as well, by way of non-limiting example.

In certain aspects, the oxide-based coating may be selected from aluminum oxide ($Al_2O_3$), titanium oxide ($TiO_2$), silicon oxide ($SiO_2$), tin dioxide (SnO), vanadium pentoxide ($VnO_5$), hafnium dioxide ($HfO_2$), zirconium dioxide ($ZrO_2$), or zinc oxide (ZnO).

With renewed reference to FIG. 7, the plurality of solid electroactive solid particles 232 having a multilayered coating, including a first coating comprising a carbon-containing coating and a second coating comprising an oxide-containing coating exit an outlet 268 of the second coating reactor 260, where they can be collected and further processed.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A method of making a negative electrode material for an electrochemical cell that cycles lithium ions, the method comprising:
centrifugally distributing a molten precursor comprising silicon and lithium by contacting the molten precursor with a rotating surface in a centrifugal atomizing reactor and solidifying the molten precursor to form a plurality of substantially round solid electroactive particles comprising an alloy of lithium and silicon and having a D50 diameter of less than or equal to about 20 micrometers.

2. The method of claim 1, wherein the alloy is represented by a formula $Li_{4.4x}Si$, where x is greater than 0 to less than or equal to about 0.85.

3. The method of claim 1, wherein the alloy is represented by a formula $Li_{4.4x}Si$, where x is greater than or equal to about 0.1 to less than or equal to about 0.5.

4. The method of claim 1, wherein the alloy comprises a phase selected from the group consisting of: $Li_{22}Si_5$, $Li_{13}Si_4$, $Li_7Si_3$, $Li_{12}Si_7$, LiSi, Si, and combinations thereof.

5. The method of claim 1, wherein a temperature in the centrifugal atomizing reactor is greater than or equal to 400° C. to less than or equal to about 1,000° C. during the centrifugally distributing.

6. The method of claim 1, wherein an environment in the centrifugal atomizing reactor has less than or equal to about 0.5% by weight of any oxygen-bearing species.

7. The method of claim 1, wherein a flow rate of the centrifugal atomizing reactor is greater than or equal to 50 kg/hour to less than or equal to about 500 kg/hour.

8. The method of claim 1, wherein the D50 diameter is greater than or equal to about 1 μm to less than or equal to about 10 μm and the plurality of substantially round solid electroactive particles has a polydispersity index of less than or equal to about 1.2.

9. A method of making a negative electrode material for an electrochemical cell that cycles lithium ions, the method comprising:

centrifugally distributing a molten precursor comprising silicon and lithium by contacting the molten precursor with a rotating surface in a centrifugal atomizing reactor and solidifying the molten precursor to form a plurality of substantially round solid electroactive particles comprising an alloy of lithium and silicon and having a D50 diameter of greater than or equal to about 1 micrometer to less than or equal to about 20 micrometers and having a polydispersity index of less than or equal to about 1.2; and passing the plurality of substantially round solid electroactive particles into a distinct reactor chamber in fluid communication with the centrifugal atomizing reactor and applying a coating to respective surfaces of the plurality of substantially round solid electroactive particles.

10. The method of claim 9, wherein the coating comprises an oxide-based coating selected from the group consisting of: aluminum oxide ($Al_2O_3$), titanium dioxide ($TiO_2$), silicon dioxide ($SiO_2$), vanadium pentoxide ($V_2O_5$), zirconium dioxide ($ZrO_2$), hafnium dioxide ($HfO_2$), tin oxide ($SnO_2$), zinc oxide (ZnO), and combinations thereof.

11. The method of claim 10, wherein the applying is an atomic layer deposition (ALD) process.

12. The method of claim 9, wherein the applying is pyrolyzing a carbon-containing precursor at a temperature of greater than or equal to about 600° C. to less than or equal to about 1,400° C. and the coating comprises a carbonaceous coating comprising both graphitic carbon and amorphous carbon.

13. The method of claim 9, wherein the distinct reactor chamber is a first reactor chamber and the coating is a first coating and the passing further comprises passing the plurality of substantially round solid electroactive particles from the first reactor chamber into a second distinct reactor chamber in fluid communication with the first reactor chamber to apply a second coating over the first coating on the plurality of substantially round solid electroactive particles.

14. The method of claim 13, wherein (i) the first coating comprises a carbonaceous coating and the second coating comprises an oxide-based coating or (ii) the first coating comprises an oxide-based coating and the second coating comprises a carbonaceous coating.

15. The method of claim 13, wherein the alloy is represented by a formula $Li_{4.4x}Si$, where x is greater than 0 and less than or equal to about 0.85.

16. The method of claim 13, wherein a temperature in the centrifugal atomizing reactor is greater than or equal to 400° C. to less than or equal to about 1,000° C. during the centrifugally distributing.

17. The method of claim 13, wherein an environment in the centrifugal atomizing reactor has less than or equal to about 0.5% by weight of any oxygen-bearing species.

* * * * *